United States Patent [19]

Ross et al.

[11] 4,257,841
[45] Mar. 24, 1981

[54] STABILIZING AND SUPPORTING APPARATUS FOR FLOAT ZONE REFINED SEMICONDUCTOR CRYSTAL ROD

[75] Inventors: John M. Ross; Kedar P. Gupta; Horst G. Kramer; John W. Burd, all of St. Louis, Mo.

[73] Assignee: Monsanto Company, St. Louis, Mo.

[21] Appl. No.: 867,640

[22] Filed: Jan. 6, 1978

[51] Int. Cl.³ ............................................. C30B 13/00
[52] U.S. Cl. .................................. 156/620; 422/250; 156/DIG. 98
[58] Field of Search ...................... 156/620, DIG. 98; 23/301; 422/250

[56] References Cited

U.S. PATENT DOCUMENTS

| | | | |
|---|---|---|---|
| 2,876,147 | 3/1959 | Kniepkamp et al. | 156/DIG. 98 |
| 3,233,984 | 2/1966 | Erdman | 422/250 |
| 3,901,499 | 8/1975 | Sporrer | 269/156 |
| 3,961,966 | 6/1976 | Keller | 156/620 |
| 3,988,197 | 10/1976 | Keller | 156/620 |
| 3,994,690 | 11/1976 | Defosse | 156/617 SP |
| 3,996,011 | 12/1976 | Keller | 156/620 |
| 4,078,897 | 3/1978 | Jericho | 156/DIG. 98 |
| 4,140,571 | 2/1979 | Herzer et al. | 156/DIG. 98 |

FOREIGN PATENT DOCUMENTS

| | | | |
|---|---|---|---|
| 1519901 | 2/1970 | Fed. Rep. of Germany | 156/620 |
| 2712506 | 9/1978 | Fed. Rep. of Germany | 156/620 |

*Primary Examiner*—Hiram Bernstein
*Attorney, Agent, or Firm*—Henry Croskell

[57] ABSTRACT

Apparatus and method for stabilizing and supporting a crystal semiconductor rod during fabrication refining from the action of a seed rod on a float zone melt of a crystalline rod source is provided wherein engageable fingers mounted in a vertically movable tube in axial register with the shaft holding the crystal seed rod are pivotally mounted in a non-horizontal upward position, the finger tips being force loaded for inward movement upon removal of a sleeve carrier so that the fingers engage, support, and stabilize the irregular cylindrical surface of the refined semiconductor rod. The tube and fingers are engageable through sleeve and tube piston means resulting in uniform stabilization and support of the crystal refined rod. The apparatus and method prevent the refined rod from vibrating and oscillating about its axis; thus allowing enlarged dislocation free crystal rod growth from a crystalline rod source, said refined crystal rod being grown on a slender seed rod.

20 Claims, 9 Drawing Figures

U.S. Patent   Mar. 24, 1981   Sheet 1 of 4   4,257,841
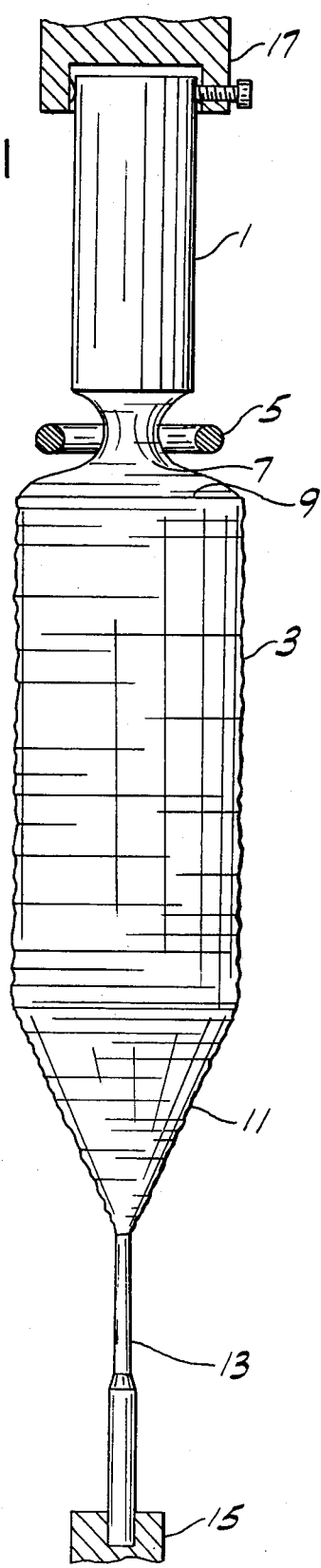
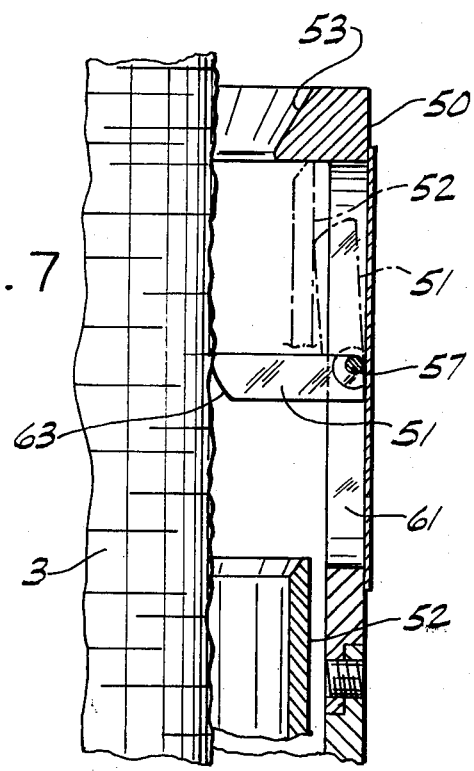
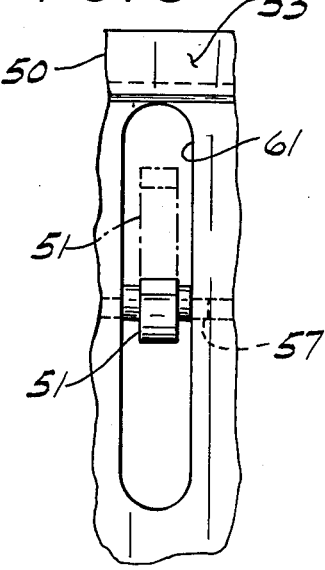

STABILIZING AND SUPPORTING APPARATUS FOR FLOAT ZONE REFINED SEMICONDUCTOR CRYSTAL ROD

BACKGROUND OF THE INVENTION

The present invention relates to an apparatus for stabilizing and supporting a zone refined crystal rod from the action of a seed rod on a melt of a crystalline source rod, and more particularly to the advancements of said apparatus which permit the processing of larger diameter rods, and longer rods, without unduly increasing the overall hazard of fracture of the crystal neck or spill of the melt zone.

Conventional apparatus for zone refining includes an induction heating chamber. A rod holder for holding a crystalline source rod to be refined is introduced into the chamber top. A seed holder for holding a semiconductor seed crystal comes into the chamber from the bottom wherein the seed crystal is held. The chamber has a door with a window, the window being necessary to permit the operator to watch the zone refining operation especially during the initial stage when the seed crystal is fused to the molten end of the semiconductor source rod. In a typical apparatus, a semiconductor source rod on the order of 110 centimeters in length can be refined. Such a source rod is attached to the rod holder at its upper end, and a small diameter seed crystal of about 4 to 6 millimeters is attached to the seed holder. A heavy RF induction heating coil of suitable design is positioned near the middle of the induction heating chamber. The chamber is then either evacuated or filled with inert gas, such as argon. The source rod holder and source rod are moved down from the top of the chamber with the free end of the rod approaching the RF induction heating coil. The RF coil inductively heats and melts the bottom or free end of the semiconductor source rod until a molten droplet is formed. At that point, the seed rod moves up to the molten end of the source rod within the heating zone of the RF coil. The seed crystal fuses and is pulled away to create a neck and then a taper at the molten end of the semiconductor source rod. Thereafter, the zone of the melt is moved up the semiconductor source rod by moving both the rod and the seed crystal downward. Relative movement between the seed rod holder and source rod holder controls the diameter of the refined crystal semiconductor rod, and in addition, the source rod holder and seed rod holder can be independently rotated as both move downwardly with respect to the induction heating chamber.

Until recently the minimum height for conventional zone refining apparatus was at least four and often five times the length of the crystalline source rod to be refined. The induction heating chamber itself had to be twice as long as the rod to accommodate the flow of movement of the source rod through the RF coil. The fully extended positions of the source rod holder and the seed rod holder were each equal to the length of the rod at a minimum. Since the initial stages of zone refining operation are very time consuming, and require constant monitoring by highly skilled operators, a determined effort has been made by the industry to process larger diameters and longer rods. Recent developments such as the use of bellows ended chambers wherein the chambers may be extended in length have permitted longer source rods and longer refined crystal rod products. For example, zone refining apparatus is provided with an induction heating chamber the longitudinal dimension which is not determined by the length of the rod to be refined, but instead is limited only by considerations of space for the RF coil and related apparatus which must be mounted within the chamber, viewing space for the operator, and the heating effect on the structure above and below the chamber. More specifically, the semiconductor rod is moved and the RF coil is stationary, just as in a conventional apparatus. However, the semiconductor rod extends above the induction heating chamber initially, and below the chamber at the conclusion of the refining process. An upper metal bellows extends from the top of the rod holder to the top of the chamber. A similar lower metal bellows extends from the bottom of the seed holder to the bottom of the chamber. The two bellows thus keep the working space both gas and vacuum tight. A telescoping group of cylinders are placed inside the lower bellows to protect the lower bellows from any molten semiconductor which may spill or drop from the melt zone.

These apparatus improvements have permitted the ever increasing size of zone refined crystal semiconductor rods not only in diameter but in length as well. Enlarged crystal rods create new problems such as increased oscillations due to the thin necking or bridging piece between the crystal source rod and the seed rod. For example, in the case of semiconductor silicon, this seed rod must be pulled down to a neck 2 to 3 millimeters in diameter and 2 to 4 centimeters in length to obtain dislocation-free crystal structure. These oscillations appear to cause a development of dislocations and other irregularities to be found in a single crystal or monocrystal zone refined rods. These oscillations also frequently cause a dripping or spilling over of the molten material from the melt zone or even a breakage of the neck between the seed crystal and the refined semiconductor rod which of course causes an interruption of the zone refining process.

Increasing refined crystal rod diameters from 25 to 75, or 100 millimeters and greater; and crystal lengths increasing from 3 to 6 fold create tremendous stress and strain on the small neck which has been expected to maintain the weight of these ever larger crystals. Provided that the weight of the enlarged refined crystal rod remains exactly centered over the neck, the neck is capable of maintaining the weight. In practice, this very seldom happens, since normally orbiting or oscillating motions occur, in which the center of the crystal at the plane of growth no longer coincides with the zone refiner axis passing through the center of the seed rod chuck, the working coil, and the crystal seed rod. Since the crystal is rotating during growth, the center describes an orbital motion about the zone refiner axis. The orbit will become larger as the crystal length increases. At present, with crystal lengths of about 50 centimeters the out of alignment orbit becomes excessive, and either the seed breaks or the melt supported by the growing rods pulls away from the melt supplied by the source rod and spills down the side of the growing crystal. In either case, not only must the run be terminated, but the already grown portion may fracture due to thermal shock.

It is therefore desirable to provide an apparatus and a method which will support and stabilize the lower portion of a grown or fabricated crystal and can restrain its lateral motion about the zone refiner axis to an acceptable low value. This supporting and stabilization must be done without contaminating the environment of the growing crystal; without causing thermal shock at points of contact between the crystal and the apparatus, and without upsetting the growth conditions at the liquid-solid interface. These conditions are necessary in order to produce single crystal semiconductor material which is free of dislocations.

BRIEF DESCRIPTION OF THE DRAWINGS

The invention will be better understood from the following detailed description taken together with reference to the drawings in which:

FIG. 1 is a front elevation with parts in section of an apparatus according to the prior art showing an upper crystalline rod source, melt zone, refined crystal rod, crystal seed rod and RF induction heating coil in operational alignment according to known float zone refining procedures;

FIG. 7 is an enlarged sectional view of the tube head, finger assembly with sleeve carrier lowered and fingers engaged; fingers disengaged position shown in phantom;

FIG. 8 is a front view of one finger element in engaged mode, non-engaged finger position shown in phantom.

DESCRIPTION OF THE PREFERRED EMBODIMENT

Figure 2:
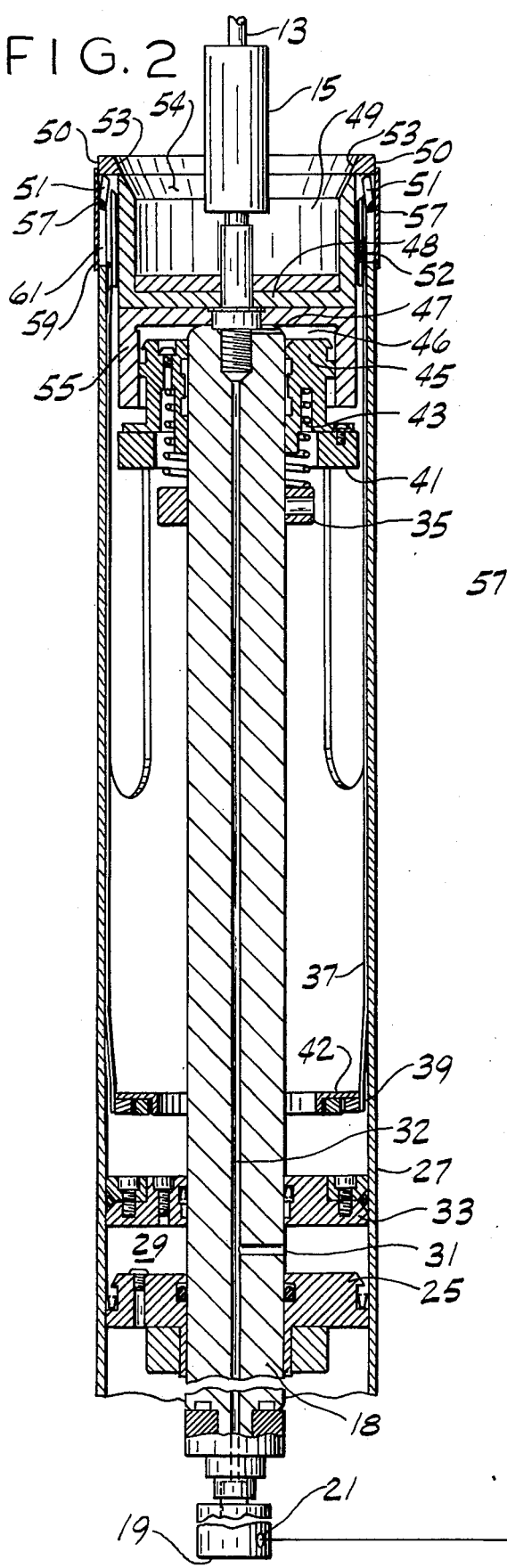
FIG. 2 is a cross-sectional view of float zone refined product crystal rod stabilizing and supporting apparatus according to the invention showing the apparatus in a non-engaged or at rest position before or after a refining process.

An apparatus is provided for stabilizing and supporting a crystal semiconductor rod, preferrably a single crystal rod during refining from the action of a seed rod of that crystal on a float zone melt of a crystalline source, preferrably a polycrystalline rod source. The apparatus supports and stabilizes through the action of engagable fingers mounted in a vertically movable tube in axial register with a shaft holding the monocrystal or single crystal seed rod, the fingers pivotally mounted in a non-horizontal upward position being force loaded which pushes the fingers inwardly upon removal of the sleeve carrier. These fingers are engagable and disengagable onto or from the irregular cylindrical surfaces or irregular inverted conical surfaces presented by the single crystal rod. The engagement occurs during in situ refining of the single crystal rod, thus the tube and finger action which are through sleeve and tube piston means, are engagable without contaminating the environment of the growing crystal, without causing thermal shock at the points of contact between the crystal and the fingers, and without upsetting the environmental conditions of the liquid-solid interface.

The environment of the growing single crystal rod is maintained through the action of the apparatus according to the invention. The apparatus provides a method for refining enlarged single crystal semiconductor rods from the action of a single crystal seed rod on a float zone melt of a polycrystalline rod source. The method according to the invention comprises arranging the semiconductor polycrystalline rod source in a float zone melt environment with a single crystal seed axially aligned thereto and attached to a lower portion thereof achieved by generating a float zone melt with the junction of a single crystal seed rod and the polycrystalline rod source and moving the float zone away from the junction resulting in the production of a cylindrical single crystal semiconductor rod. Uniform stabilizing and supporting of the enlarged single crystal semiconductor rod during growth on the single crystal seed rod is accomplished by moving upwardly in axial register with the single crystal rod lower end portion, a tube to a position surrounding the growing crystal rod base portion and engaging fingers from the inside diameter of the tube and contacting the fingers with the surface of the single crystal rod thus preventing lateral movement of the refined crystal.

To obtain dislocation free crystal rod material, it is necessary to grow from the single crystal seed a neck which must be no larger than a few millimeters in diameter and at least about 20–30 millimeters long. A prior art representation, FIG. 1, in general illustrates the physical relationships between a single crystal seed rod, single crystal rod, neck and float zone melt from a polycrystal source. In this neck, any dislocations which were present in the seed or were generated by thermal shock when the melt touched the seed crystal, are made to grow out of the crystal. After completion of the neck, the crystal is made to grow out gradually in a conical shape, until the desired diameter is reached. Crystal growth proceeds at this diameter until all the polycrystal source rod has been converted into a cylindrical single crystal rod. As a consequence, during the run, the entire weight of the already grown single crystal rod rests on the slender neck originally drawn.

The engagable fingers according to the invention not only position and stabilize the refined crystal rod during refining, but they also provide support for the ever increasing rod weight causing settling of the rod into the fingers and thermal contraction of the rod as a result of zone refining environment. The fingers are of variable lengths therefore when engaged against the irregular surface of the refined crystal rod, some of the fingers will engage on a horizontal plane while others will engage at various angles depending on their length and the contact surface character of the rod. As the rod grows in weight and dimension, the rod will settle ever so slightly in the vertical plane which is also accentuated by thermal contraction as the rod cools; therefore, the in situ engaged fingers which originally stabilize the rod in a vertical axial alignment become supportive in nature. This supporting role increases with the downward vertical thermal contraction and weight increase on the fingers in engaged position.

Engagement of the stabilizing and supporting fingers is very gentle in relationship to the environment of the zone refining process since only the weight of the individual fingers act on the rod during the activation mode or in the alternative, only a very slight spring load or force engages the fingers. Preferably three or more, or more preferrably, nine or more variable length fingers are utilized according to the invention for stabilization adjustment of the irregular refined crystal surface. The tip of these engagable fingers can be of various geometric shapes and include such refinements as abrasive surfaces and the like in order to more firmly grip and support the ever changing downward force exerted upon the engaged fingers by the contracting and growing crystal rod. The invention is not limited to a single ring of engagable fingers, for example, two or more rings at different crystals heights could be utilized as necessary as the technology of zone refining advances to the point where longer and larger diameter crystal rods are produced.

Referring to the drawings wherein the same reference numerals refer to indentical or corresponding parts throughout the several views. The prior art representation of FIG. 1 shows from a front elevation view with parts in section of a crystalline rod source 1 communicating with a crystal rod 3 through a float melt zone 7 as created by the RF induction heating coil 5. Since the two rods are being rotated not necessarily at the same speed or same direction, the float zone melt and recrystallization zone 9 are very sensitive to misalignment, oscillations and orbiting as well as thermal shock. The float melt zone 7 also provides no upper vertical axial stabilization since it is in effect a free, detached end of the vertically supported enlarged crystal rod which is supported solely as taught by prior art systems by the neck 13. The seed rod 14 is held by chuck 15 and communicates with the crystal rod through a crystal rod neck 13 and taper 11 while the upper crystalline source rod is held in place by a chuck 17.

The float zone refined crystal rod stabilizing and supporting apparatus is presented in FIG. 2 in cross-sectional view with the uppermost part of the view as seed rod 13 in position on shaft 18 in axial alignment with the zone refiner source rod and RF induction heating coil which are not shown in FIG. 2. The stabilizing and supporting apparatus is axially aligned and attached to shaft 18 which has a rotary union 19 and a shaft fluid inlet 21 at its lower end portion. The shaft fluid inlet 21 is in communication with a pressure regulator 23 and shaft fluid channel 32. Shaft 18 supports an axially aligned tube 27 affixed to the shaft 18 through a lower head member 25, the shaft 18 extending axially through the length of the tube 27 terminating at an upper end in a seed rod chuck 15 and terminating at the lower end in a rotary union 19. The tube 27 terminates at an upper end in an inwardly projecting ring member 50 with an upper end portion mounted with at least three force loaded pivotal fingers 51 within the tube walls upper end portion outer ring 59 which defines finger element chamber 61 in cooperation with sleeve upper end portion offset ring carrier 52. The tube 27 is friction fitted with a slidable mounted inside sleeve 37 having an upper end portion of inside offset dimension, offset ring carrier 52, for supporting the force loaded fingers 51 with the force acting on the fingers to pivot the fingers inwardly from the pivot 57. The force loaded fingers 51 are in a non-engagable position in an upward non-horizontal position in finger chamber 61 as shown in FIG. 2. The sleeve 37 extends axially downward along the tube 27 and terminates with an inside diameter ring member 39 located above a slidable shaft mounted lower piston member 33 which defines a lower chamber 29 in combination with the tube 27 and lower head 25. Shaft 18 has an upper head 48 in at rest contact with tube 27 terminating inside diameter ring 50 through an upwardly extending upper cylindrical bowl 49 which in combination with the upper tube end ring inverted conical slope surface 53 define a protective barrier or cup for the finger 51 when in a non-engaged position. This cup configuration protects the apparatus from spills or splashes of molten material which would through gravity action fall into the region during float zone refining. The shaft 18 upper head 48 extends downward through a lower cylindrical bowl 49 defining in combination with an upper shaft piston 45, a chamber 46. Shaft 18 has a shaft collar 35 positioned below the upper piston 45 with the collar 35 providing support for a spring element 43 wherein the spring element is in contact with the upper piston 45 and provides thereon an upward force from the shaft mounted collar 35. The upper piston 45 has a lower ring member radially outside the shaft collar 35 and in register with the sleeve ring upper surface 42, the upper piston lower surface ring having a magnetic means 41. Shaft 18 has an axial fluid passage 32 therethrough, passage 32 communicating with the lower chamber 29 through a first fluid port 31 and communicating with the upper chamber 46 through a second fluid port 47. The fluid passage 32 communicates with exterior pressure regulator means 23 beyond the lower end of the tube 27 through shaft fluid inlet 21.

In a preferred embodiment sleeve 37 is constructed as follows: Ring carrier 52 is maintained in elevation by friction delivered to walls of tube 27 by a minimum of two spring slides 38. Spring slides 38 also serve to connect ring carrier 52 with lower end ring member 39. Spring slides 38 are bent before assembly in tube 27 to provide sufficient force against the walls of tube 27 to develop slightly more friction force than required to support the weight of the carrier assembly.

The stabilizing and supporting float zone apparatus according to the invention provides a method for refining enlarged crystal semiconductor rods by refining a crystal seed rod activated crystalline rod source melt into a crystal rod. The enlarging or fabricating crystal rod is in situ stabilized by the action of a tube 27 movable upwardly in axial register with the crystal rod 3 lower end portion to a position surrounding the growing crystal rod 3 body and engaging fingers 51 from the inside diameter of the positioned tube 27 and contacting the fingers 51 with the surface of the crystal rod 3. The circle of fingers 51 is raised to the crystalline rod 3 cylindrical portion by fluid activation means, preferrably inert gas means through regulator 23. Gas enters the lower chamber 29 through first fluid port 31, raising the lower piston 33, tube 27 and connected parts until the lower piston 33 contacts collar 35 and friction sleeve lower end 39 is brought up to close proximity to the upper piston lower surface magnets 41. Gas pressure is limited by regulator means 23 but is sufficient to raise tube 27 through lower piston 33 but not sufficient to compress spring 43. After the tube 27 is raised and when the operator manually selects or in the alternative, when piston 33 automatically comes in contact with collar 35, the regulator pressure is increased sufficiently to lower the upper piston 45 through the action of the gas pressure on upper chamber 46 thus lowering upper piston 45 to shaft collar 35 through the action of the gas flowing through the second gas port 47. As the upper piston 45 lowers, magnets 41 contact the upper surface of sleeve lower end ring 42 lowering the sleeve upper end portion offset ring carrier 52 and allowing fingers 51 to pivot towards the refined crystal rod 3 through the action of spring or gravity force means.

Fingers 51 are of varied lengths and contact the crystal rod 3 at various angles depending on the finger length and crystalline surface shape. Several fingers will contact in a near horizontal position and will be self locking. Other fingers may not contact the crystal, however, a sufficient number of fingers will lock to affect the stable support and prevent movement of the crystal rod in a horizontal plane. After the refining process is complete, the crystal rod 3 can be supported with exterior means and pulled out of the refiner apparatus after the neck 13 has been scribed. Reducing the gas pressure through regulator 23 returns upper piston 45 and tube 27 to their original rest positions. The force to raise the sleeve upper end portion offset ring carrier 52 is delivered to friction sleeve lower end ring member 39 by magnets on the lower surface ring 42 of upper piston 45. When the tube 27 lowers, the magnetic surface 41 is separated from the friction sleeve lower end ring.

Figure 9:
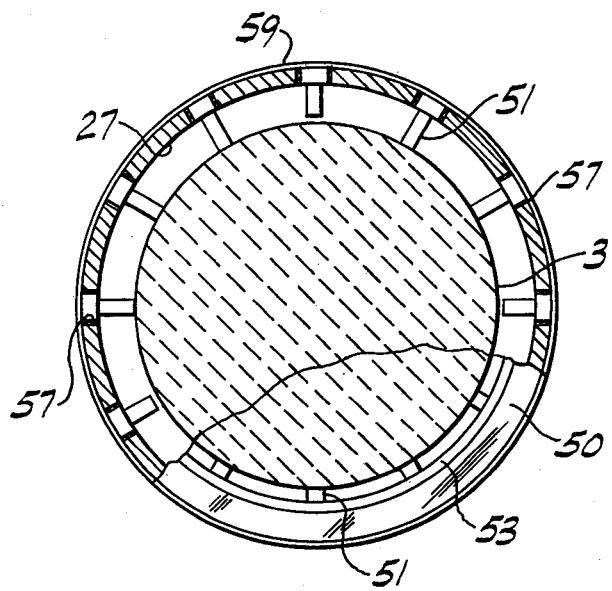
FIG. 9 is a cross-sectional view taken along the line 9—9 of FIG. 5, showing the fingers in an engaged position as represented in FIG. 6.
Figure 4:
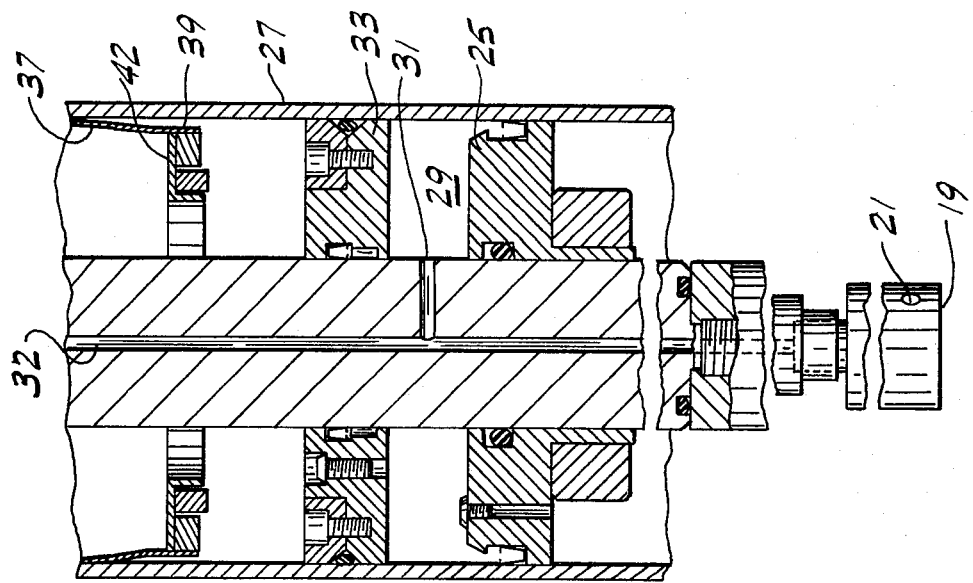
FIG. 4 is an enlarged sectional view of the lower portion of the float zone crystalline rod stabilizing and supporting apparatus but showing a more detailed lower head, shaft, lower piston, sleeve and tube arrangement.
Figure 3:
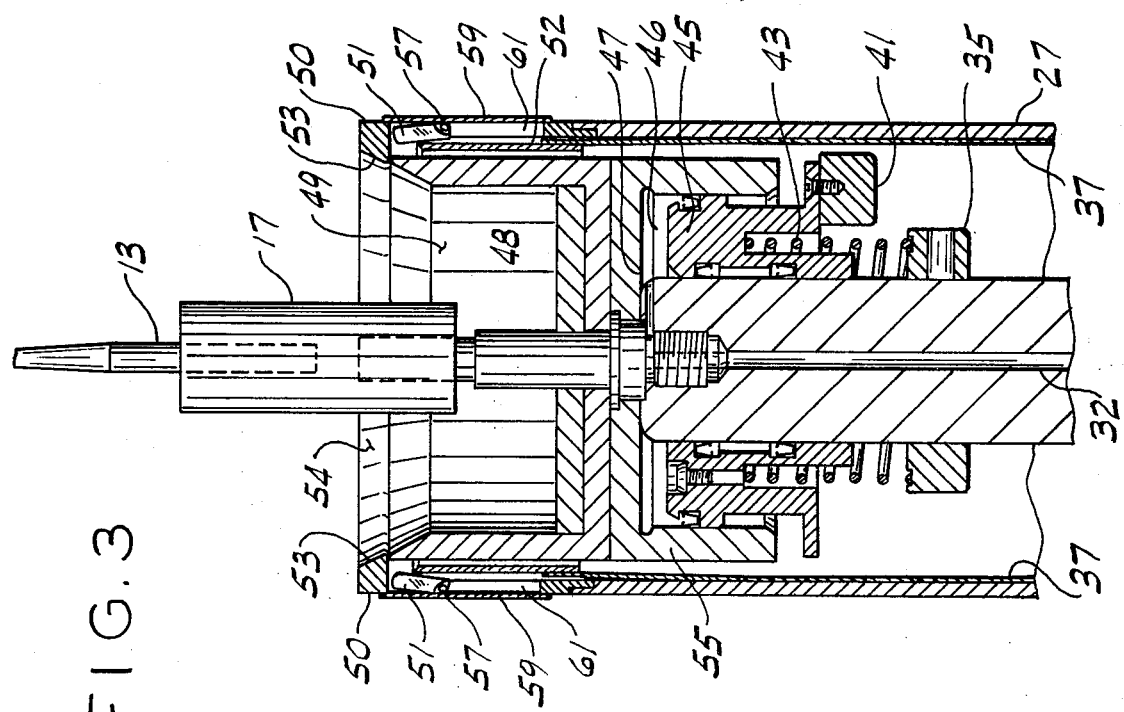
FIG. 3 has an enlarged sectional view of the upper portion of the float zone refined product crystal rod stabilizing and supporting apparatus according to the invention showing in more detail the upper head, tube, sleeve carrier and non-engaged finger arrangement.
Figure 5:
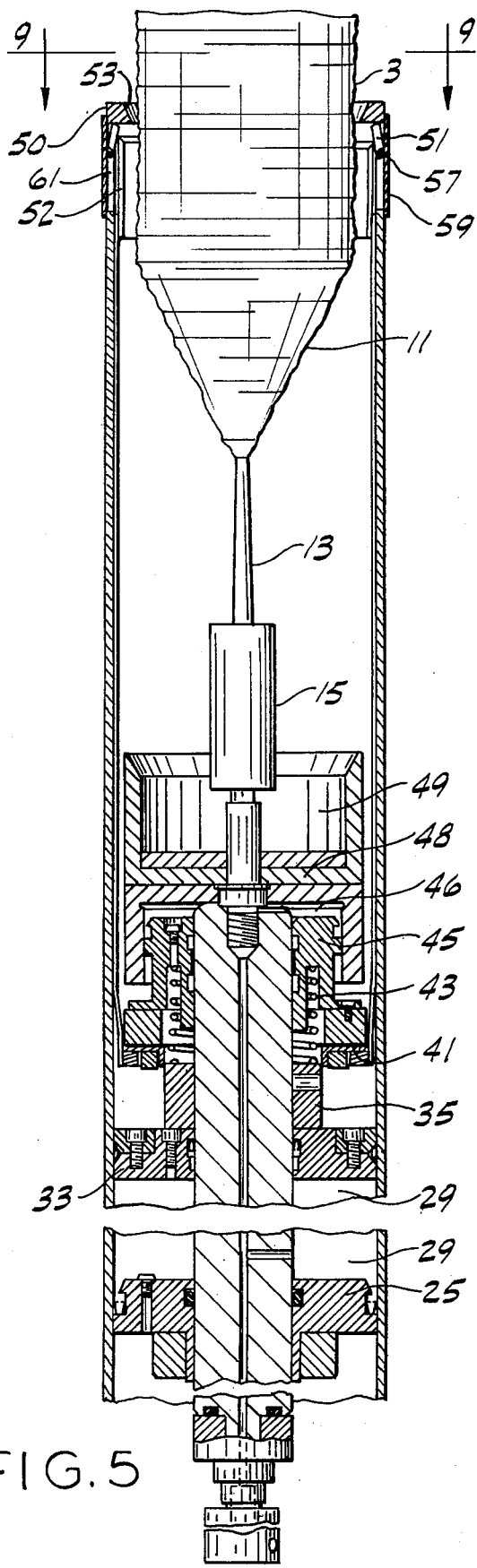
FIG. 5 is a cross-sectional view of the float zone refined crystal rod stabilizing and supporting apparatus with the tube elevated into finger engagable positions relative to the crystal rod.
Figure 6:
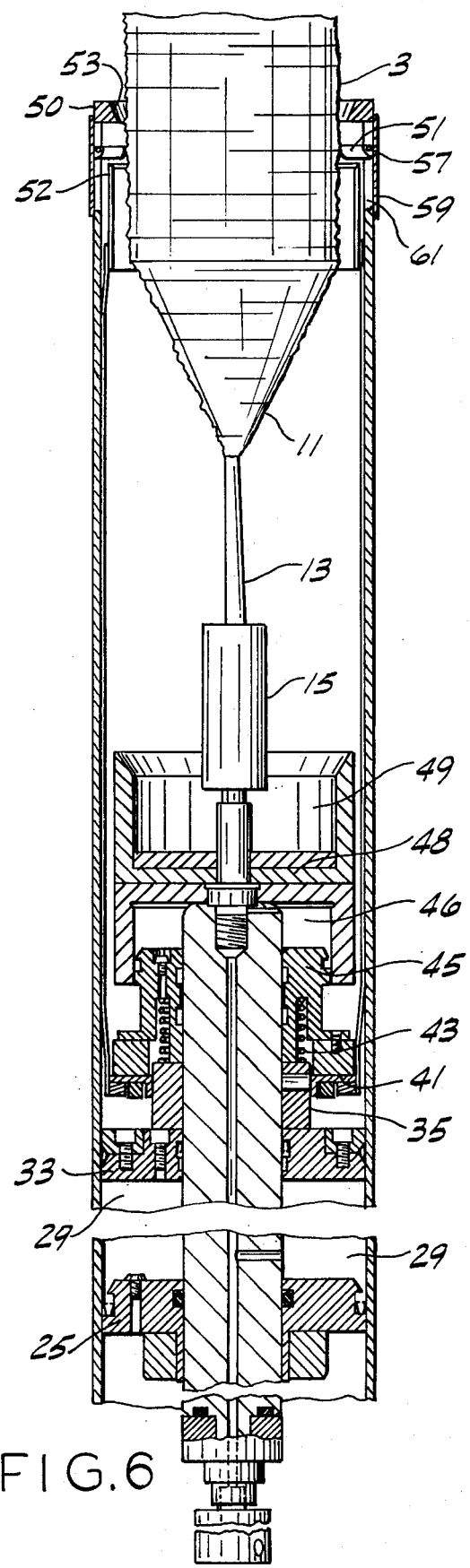
FIG. 6 is a cross-sectional view of the float zone refined crystal rod stabilizing and supporting apparatus with the tube elevated into finger engaged position with the sleeve carrier withdrawn and the finger in contact with the crystal rod.

The operation from rest through engagement, disengagement and back to rest can more fully be appreciated by viewing FIGS. 5 and 6 which show respectively, cross-sectional views of the apparatus with the tube elevated into finger engagable positions relative to the crystal rod and with the sleeve withdrawn therefrom allowing the fingers to be engaged against the crystal rod. FIGS. 7, 8, and 9 provide additional detail in regard to the fingers 51 and the pivotal movement thereof when the carrier 52 is lowered. FIGS. 3 and 4 provide additional detail on a cut away basis, that is, enlarged sectional view of the upper portion and lower portion of the apparatus according to the invention.

Having described a preferred embodiment of the invention, it will be apparent to those skilled in the art that modifications and variations can be made in the practice of the invention as defined in the appended claims.

What is claimed is:

1. Method for refining enlarged crystal semiconductor rod formed from the action of a crystal seed rod on a float zone melt of a crystalline rod source comprising: arranging the semiconductor crystalline rod source in a float zone melt environment with a crystal seed rod axially aligned thereto and attached to a lower portion thereof; generating a float zone melt with the junction of the crystal seed rod and the crystalline rod source and moving the float zone away from said junction resulting in the production of a cylindrical crystal semiconductor rod; and uniformly stabilizing and supporting the enlarged crystal semiconductor rod being drawn on the crystal seed rod in order to prevent misalignment at the juncture of the melt; growing crystal semiconductor rod from the crystalline rod source, the uniform stabilizing and supporting of the growing crystal semiconductor being accomplished by moving upwardly in axially register with the crystal rod lower end portions, a tube to a position surrounding the growing crystal rod base; engaging the growing crystal rod base with individually engaging fingers at differing engagement angles from the inside diameter of the tube and contacting the fingers with the surface of the crystal rod.

2. A method according to claim 1 wherein single crystal silicon is produced which is dislocation free.

3. The method according to claim 1 also comprising disengaging the fingers upon completion of refining the enlarged crystal semiconductor rod.

4. The method according to claim 1 comprising engaging the fingers during refining of the enlarged crystal semiconductor rod.

5. The method according to claim 1 wherein enlarged crystal semiconductor rods are formed having diameters of at least 50 to 75 millimeters.

6. The method according to claim 1 wherein the stabilizing and supporting action of the fingers is enhanced through thermal contraction and weight settling action exerted by the enlarged rod.

7. The method according to claim 1 wherein the engaged fingers prevent orbiting through axial stabilization.

8. The method according to claim 2 wherein the stabilization and supporting action of the fingers prevents oscillations of the single crystal silicon rod and melt zone spill.

9. Apparatus for stabilizing and supporting a crystal semiconductor rod during refining from the action of a crystal seed rod on a float zone melt of a crystalline rod source, comprising:
a shaft supported axially aligned tube affixed to the shaft through a lower head member to a lower end portion of the tube, said shaft extending axially through the length of the tube terminating at an upper end in a slim seed rod chuck and terminating at a lower end in a rotary union, said tube terminating at an upper end in an inwardly projecting ring member with an upper end portion mounted with at least three force loaded pivotal fingers within the tube walls, said tube friction fitted with a slidably mounted inside sleeve having an upper end portion of inside offset dimension for supporting the force loaded fingers in upward, non-horizontal, non-engaged position; said sleeve extending axially downward along the tube and terminating with an inside diameter ring member located above a slidable shaft mounted lower piston member which defines a lower chamber in combination with the tube and lower head; the shaft having an upper head in contact with the upper tube terminating ring member through an upwardly extending upper clyindrical bowl means; said shaft upper head extending downwardly through a lower cylindrical bowl means defining in combination with an upper shaft piston, an upper chamber; a shaft collar positioned below said upper piston, said collar providing support for a spring element in contact with the upper piston; said upper piston having a lower member radially outside the shaft collar and in register with the sleeve ring upper surface, said member lower surface mounted with magnetic means; the shaft having an axial fluid passage therethrough, said passage communicating with the lower chamber through a first fluid port, the upper chamber through a second fluid port, said passage communicating with exterior fluid regulator means beyond the lower end of the tube.

10. The apparatus according to claim 9 where the fingers are engagable during fabrication of a single crystal semiconductor rod from a polycrystal rod source.

11. The apparatus according to claim 9 wherein nine or more spaced apart variable length fingers are employed.

12. The apparatus according to claim 10 wherein the fingers are force loaded for pivotal movement inwardly and having gripping surfaces which contact the single crystal semiconductor rod.

13. The apparatus according to claim 9 wherein the upper head and the tube terminating inside diameter ring provide a spill protection cup for the fingers when in a non-engaged mode.

14. The apparatus according to claim 9 wherein the regulated fluid is an inert gas.

15. The apparatus according to claim 9 wherein the ring carrier is maintained in elevation by tube wall friction against at least two spring slides; the spring slides connecting the ring carrier and the lower end ring member; the spring slides being outwardly fixed before assembly in the tube resulting in assemblied friction forces required to support the weight of the carrier assembly.

16. Apparatus for stabilizing and supporting a single crystal semiconductor rod during fabrication from the action of a single seed rod on a float zone melt of a polycrystal rod source, comprising:

three or more spaced apart engageable fingers of equal or variable lengths of up to about 10 millimeters, mounted in a vertical tube, said tube in axial register with a shaft holding the single crystal seed rod, said fingers pivotally mounted in a non-horizontal upward position, said fingers force loaded for inward movement upon removal of a sleeve carrier, said fingers engeable on irregular cylindrical surfaces or irregular inverted conical surfaces, said tube and fingers being retractable through sleeve and piston means whereby said fingers are retracted through sleeve carrier engagement forcing said fingers into a rest position while said tube is retracted through attached piston withdrawal.

17. The apparatus according to claim 16 wherein the fingers have a crystal semiconductor rod gripping contact surface.

18. The apparatus according to claim 16 wherein the fingers are spring loaded for inward pivotal motion.

19. The apparatus according to claim 16 wherein the fingers are gravity loaded for inward pivotal motion.

20. The apparatus according to claim 16 wherein a second ring of fingers are contained in the vertically movable tube.

* * * * *

UNITED STATES PATENT AND TRADEMARK OFFICE
CERTIFICATE OF CORRECTION

PATENT NO. : 4,257,841

DATED : March 24, 1981

INVENTOR(S) : John M. Ross, et al

It is certified that error appears in the above-identified patent and that said Letters Patent are hereby corrected as shown below:

Column 9, line 22, "fixed" should read --flexed--.

Signed and Sealed this

Sixteenth Day of June 1981

[SEAL]

Attest:

RENE D. TEGTMEYER

Attesting Officer

Acting Commissioner of Patents and Trademarks